United States Patent [19]

Anacker et al.

[11] 3,758,795

[45] Sept. 11, 1973

[54] SUPERCONDUCTIVE CIRCUITRY USING JOSEPHSON TUNNELING DEVICES

[75] Inventors: Wilhelm Anacker, Katonah; Juri Matisoo, Yorktown Heights, both of N.Y.

[73] Assignee: International Business Machines Corporation, Armonk, N.Y.

[22] Filed: June 30, 1972

[21] Appl. No.: 267,841

[52] U.S. Cl. ................. 307/306, 307/212, 307/218, 307/277, 317/234 T

[51] Int. Cl. ......................... H03k 3/38, H03k 19/02

[58] Field of Search .................... 307/212, 277, 306; 317/234 T

[56] References Cited

UNITED STATES PATENTS

| | | | |
|---|---|---|---|
| 3,458,735 | 7/1969 | Fiske | 307/306 |
| 3,588,777 | 6/1971 | Schroen | 317/234 T |
| 3,676,718 | 7/1972 | Anderson et al. | 307/277 X |

*Primary Examiner*—John Zazworsky
*Attorney*—Jackson E. Stanland et al.

[57] ABSTRACT

Superconductive circuitry using a first Josephson tunneling device connected to a transmission line having a termination such that no reflections result when the Josephson tunneling diode switches between two stable voltage states, in accordance with applied input signals. Means are provided for producing the input signals to switch the first Josephson tunneling device and further Josephson tunneling devices are provided whose voltage state depends on the current pulse delivered to the transmission line when the first Josephson tunneling device switches from a first voltage state to a second voltage state. Logic circuitry is shown using this structure, as well as fan-in and fan-out Josephson tunneling device circuits.

16 Claims, 6 Drawing Figures

SUPERCONDUCTIVE CIRCUITRY USING JOSEPHSON TUNNELING DEVICES

BACKGROUND OF THE INVENTION

1. Field of the Invention

This invention relates to circuitry using Josephson tunneling devices and more particularly to superconductive circuitry in which a precisely determined control pulse is derived from a switching Josephson tunneling device connected to a transmission line having proper terminations for prevention of reflections.

2. Description of the Prior Art

Josephson tunneling devices are superconductive elements exhibiting a zero voltage current state in which pair tunneling exists, and a finite voltage state in which single particle tunneling exists. The existence of a zero voltage state in a superconductive tunnel junction was first described in July 1962 by B. D. Josephson. Since that time, these devices have been proposed for applications in memory and logic. For instance, U.S. Pat. No. 3,626,391 describes a superconductive memory using Josephson tunneling devices in which memory cells comprised of superconducting loops are used. Josephson junctions determine the direction of current flow in the superconducting loops and they are also used for sensing the current in these loops.

U.S. Pat. No. 3,281,609 describes a logic device using Josephson tunneling junctions in which the magnetic fields applied to the junction cause the junction to switch voltage states, depending upon whether or not the maximum zero voltage current through the junction is exceeded. Externally applied magnetic fields are used to lower the threshold current (zero voltage current) of the tunnel junction so that switching to a finite voltage state occurs.

Although applications for Josephson tunneling junctions are known in the prior art, the prior art does not show how to develop a precise control signal for switching Josephson tunneling junctions which is dependent only on the gap voltage property of the Josephson tunneling junction whose switching gave rise to the control signal. That is, the prior art has not shown how to develop a precisely controlled signal from a Josephson tunneling junction which can be used to control the voltage state of succeeding Josephson tunneling junctions. In particular, the control signal developed when a first Josephson tunneling junction switches depends to a large extent on the input current $I_{g1}$ to the first Josephson tunneling junction. Because it is difficult to control the tolerances and gain curves for numerous Josephson tunneling devices, it has been difficult to obtain precise control signals for use in many stages of circuitry in an array of Josephson tunneling devices. This effect is particularly pronounced in logic circuitry where tolerances of individual elements and stages of a circuit are very important. That is, provision of control signals used to switch various stages of a logic circuit require that the same magnitude of such signals be obtained throughout various stages of logic circuitry so that an adverse effect will not occur which is magnified in proportion to the number of stages of circuitry.

Furthermore, it is important to utilize Josephson tunneling devices in circuits which enable one to take full advantage of the high speed capabilities of Josephson tunneling devices. Heretofore it has not been recognized that Josephson tunneling devices could be used in circuits which would operate at speeds consistent with the switching speeds of the individual Josephson tunneling junctions. In fact, the particular problem which limits circuit speed was not appreciated by the prior art, including the prior art using superconductive cryotron elements.

Applicants have discovered that the solution to the problem of providing predictably constant control signals from switching Josephson tunneling devices also solves the problem relating to the speed of circuitry containing Josephson tunneling devices. Furthermore, the solution to these problems is a solution which is applicable to any type of Josephson tunneling device circuit. It finds particular application in logic circuits utilizing Josephson tunneling devices, and embodiments specifically for logic applications will be shown as preferred embodiments in this application.

Accordingly, it is a primary object of the present invention to provide Josephson tunneling device circuits which provide control over the voltage state of numerous Josephson tunneling devices in a predictable fashion.

It is another object of this invention to provide circuitry using Josephson tunneling devices whose speed is consistent with the switching speeds of individual tunnel junctions.

It is still another object of this invention to provide Josephson tunneling device circuits which will provide control signals to other stages of circuitry which control signals do not depend upon the tolerances of individual Josephson tunneling devices, nor on the variance of characteristics (other than the gap voltage) among individual Josephson tunneling devices.

It is a further object of this invention to provide superconductive circuits using Josephson tunneling devices which are capable of high speed operation with improved fan-in and fan-out capabilities.

It is a still further object of this invention to provide high speed Josephson tunneling device circuits which can be easily fabricated using conventional planar technology.

BRIEF SUMMARY OF THE INVENTION

A superconductive circuit is provided having at least one Josephson tunneling device whose electrodes are connected to a superconductive transmission line. Current means are connected to the electrodes of the Josephson tunneling device for providing a junction current therethrough. Also connected to the electrodes of the Josephson tunneling device is a superconducting transmission line which is terminated in an impedance which will prevent reflections of current pulses along the transmission line. These current pulses (or voltage pulses) in the transmission line arise when the voltage state of the Josephson tunneling device changes.

Control means are provided for determining the voltage state of the Josephson tunneling device connected to the transmission line. This control means can preferably be a single conductor or a plurality of current carrying conductors, the current through which creates a magnetic field which intercepts the Josephson tunneling device and alters its threshold current in a known manner (U.S. Pat. No. 3,281,609). Of course, additional current can be provided in the Josephson tunneling device to exceed its threshold current to produce switching. However, this is not a particularly advantageous way of changing the voltage state of the Josephson device, as will be more fully appreciated later.

At least one other Josephson tunneling device is preferably located close to the transmission line. The magnetic field produced by a current pulse in the transmission line couples to this other Josephson tunneling device to affect the maximum threshold current in the second Josephson tunneling device. Thus, a change in the voltage state of the Josephson tunneling device connected to the transmission line will cause current to flow in the transmission line which affects other Josephson tunneling devices located in proximity to the transmission line. In this manner extensive fan-out is provided.

As will be more fully appreciated in the following discussion, the speed of this circuit is great because virtually no reflections result even with large fan-out. This means that a single current pulse will remain in the transmission line as long as the current supplied to the Josephson device connected to the transmission line is maintained. Therefore, immediate switching in a controllable fashion of other Josephson tunnel devices is possible. Further, the current pulse in the transmission line (which is used as a control pulse) depends only upon the band-gap voltage of the Josephson tunneling device connected to the transmission line and upon the termination of the line. The magnitude and polarity of the control pulse in the transmission line does not depend on the gain curve for the Josephson tunneling device connected to the transmission line nor does it depend on any tolerances of this Josephson tunneling device. This is particularly important when numerous Josephson devices are connected to the transmission line, and when the circuitry comprises a plurality of stages all of which are coupled together in sequence to provide a logical output.

DETAILED DESCRIPTION OF THE PREFERRED EMBODIMENTS

Figures 1A, 1B:
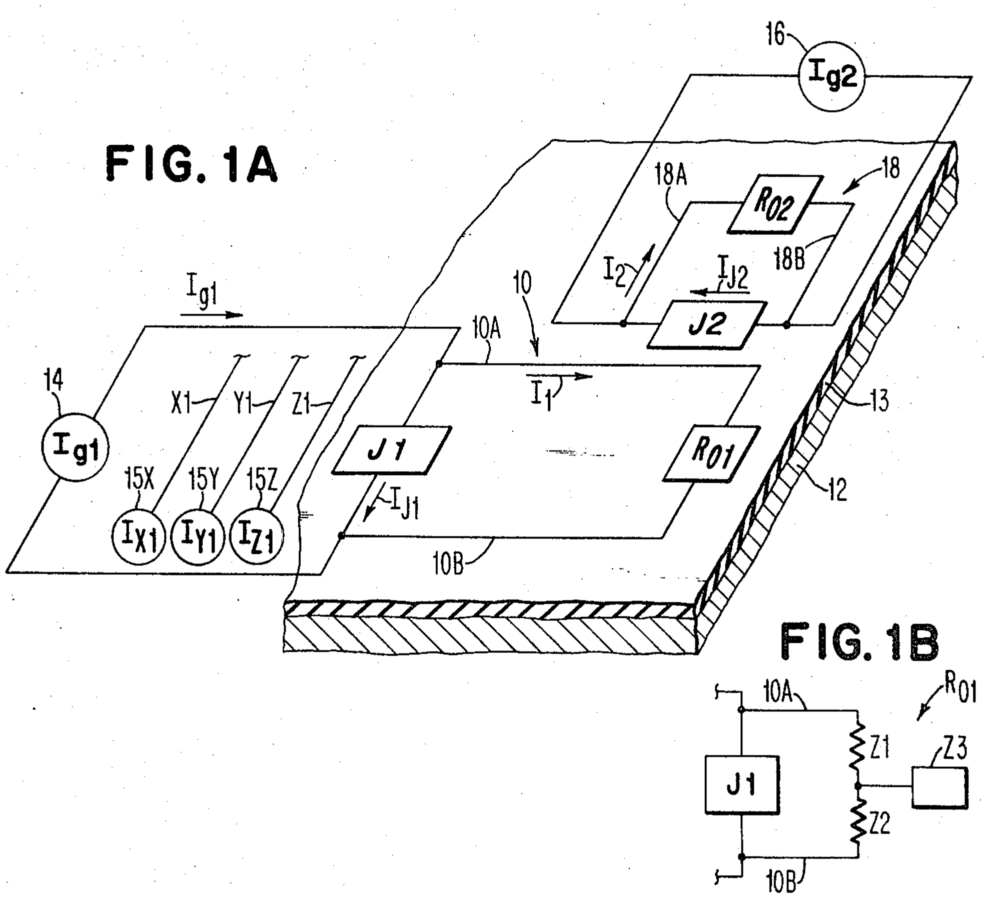
FIG. 1A is a schematic illustration of a superconductive circuit having a Josephson tunneling device connected to a transmission line terminated so as to prevent reflections when the Josephson tunneling device switches voltage states.
FIG. 1B is a portion of the circuitry of FIG. 1A in which the termination $R_{01}$ will prevent virtually all reflections in the transmission line even if there is extensive fan-out.

FIG. 1A is a schematic diagram of a superconductive circuit having a Josephson tunneling junction connected to a transmission line which is terminated such that current pulses in the transmission line are not reflected back to the Josephson tunnel device.

In more detail, a Josephson tunnel device J1 has its electrodes connected to a transmission line indicated generally by the numeral 10. In this particular diagram, transmission line 10 is comprised of a first strip line 10A and a second strip line 10B which are insulated from a superconductor ground plane 12 by insulation 13. If desired, a conventional transmission line can be connected to the Josephson tunnel device J1, which would eliminate the need for the ground plane 12. This particular embodiment is suitable for circuit fabrication in thin film form, since strip lines 10A and 10B can easily be deposited on an insulated ground plane 12.

Connected to Josephson device J1 is a current source 14 which provides current $I_{g1}$. This current flows to the parallel combination of the Josephson device J1 and the transmission line 10. All of current $I_{g1}$ flows through J1 when J1 is in its zero voltage state; only when J1 switches to its non-zero voltage state does $I_{g1}$ split and a current $I_1$ flow in transmission line 10. That is, $I_{g1} = I_{J1} + I_1$ when J1 is in its non-zero voltage state.

Located adjacent tunnel device J1 are control conductors X1, Y1 and Z1. These conductors are connected to current sources 15X, 15Y, 15Z respectively or to other circuitry for provision of currents therein. For instance, current $I_{X1}$ flows in control conductor X1, current $I_{Y1}$ flows in conductor Y1, and current $I_{Z1}$ flows in control conductor Z1. Depending upon the presence and absence of control current in the control conductors, the maximum Josephson current which can flow through J1 is varied. That is, control currents in the control conductors establish magnetic fields which intercept tunnel device J1 and affect the maximum Josephson current which can flow through J1 in its zero voltage state.

Depending upon the control currents flowing in control conductors X1, Y1 and Z1, the Josephson tunnel device J1 can be made to switch from a zero voltage state to a finite voltage state at which time the band gap voltage exists across Josephson tunnel device J1. This will produce a current pulse I which flows through transmission line 10. In this invention, transmission line 10 is terminated in an impedance $R_{01}$ which is such that current pulse I will not be reflected back to tunnel device J1. For the strip line configuration of FIG. 1A, this termination is twice the characteristic impedance $Z_0$ of each strip line 10A, 10B.

If transmission line 10 is not terminated properly, reflections in the line will result and a period of time will have to pass before nominal current flows through transmission line 10 to be used as a control signal to control the voltage state of other Josephson tunnel devices, such as device J2. This means that, in addition to the delay for the current pulse to travel from J1 to termination $R_{01}$, a further time will be required for the circuit to achieve stability. For high speed logic applications this is a serious problem.

In the circuit of FIG. 1A, the current pulse $I_1$ has a magnitude equal to $V_g/R_{01}$. That means that tolerance on the output current pulse $I_1$ is essentially as good as tolerance on $R_{01}$ can be held, since $V_g$ is the band gap voltage of device J1 and is only weakly temperature dependent. $V_g$ can be held to a tolerance better than 1%.

In FIG. 1A, strip line 10A is a control line located in proximity to another Josephson tunnel device J2. This means that the current pulse $I_1$ in strip line 10A will produce a magnetic field intercepting device J2. This magnetic field will determine the Josephson threshold current of J2 and therefore will determine its voltage state, in the same manner that the voltage state of J1 is determined by the presence and absence of currents in control conductors X1, Y1, and Z1. It should be understood that a plurality of control conductors can be provided for J2 in the same manner as the plurality of control conductors shown for J1. That is, further strip lines can be located in the proximity of J2, the current through which also provides magnetic fields intercepting J2. These other superconducting strip lines are also terminated in an impedance sufficient to eliminate reflections in them.

In FIG. 1A, Josephson tunneling device J2 is connected to a current source 16 which provides current $I_{g2}$. Also connected to the electrodes of J2 is a superconductive transmission line generally designated 18. In the embodiments shown, transmission line 18 is comprised of superconductive strip lines 18A and 18B. As with strip lines 10A and 10B, strip lines 18A and 18B are located over superconductive ground plane 12. Transmission line 18 is terminated in an impedance $R_{02}$ which has a value such that no reflections of current pulses will occur in transmission line 18.

The operation of the circuit comprising J2 and transmission line 18 is the same as that for J1 in transmission line 10. That is, when device J2 is switched to a finite voltage state, a current $I_2$ flows in transmission line 18. Because the termination $R_{02}$ is the sum of the characteristic impedances of strip lines 18A and 18B, reflections will not result. Therefore, current in strip lines 18A and 18B can be used for control currents for additional Josephson tunneling devices.

FIG. 1B illustrates a portion of the circuit of FIG. 1A in which the termination $R_{01}$ is comprised of three impedances Z1, Z2, and Z3. This type of termination is used to prevent reflections on line 10 when the current pulse $I_1$ is used as a control pulse for numerous Josephson tunnel devices located adjacent transmission line 10.

Z1 is the characteristic impedance of strip line 10A, Z2 is the characteristic impedance of strip line 10B, and Z3 is an impedance having a value of about 0.1Z1 or 0.1Z2. Generally, strip lines 10A and 10B are the same length and have the same characteristic impedance. Z3 is of low characteristic impedance and of proper length for suppression of reflections which are generated anywhere along transmission line 10. By adding impedance Z3 to the center point of impedances Z1 and Z2 the reflection factor of line 10 is reduced even if fan-out is employed.

Impedance Z3 is preferably an open-ended transmission line of proper characteristic impedance and of sufficient length with respect to the rise time of pulses expected on line 10 to improve the matching conditions for signals induced anywhere along line 10. That is, the length of Z3 is such that delay of pulses traveling along it is longer than the rise time of pulses expected on line 10.

Figure 2:
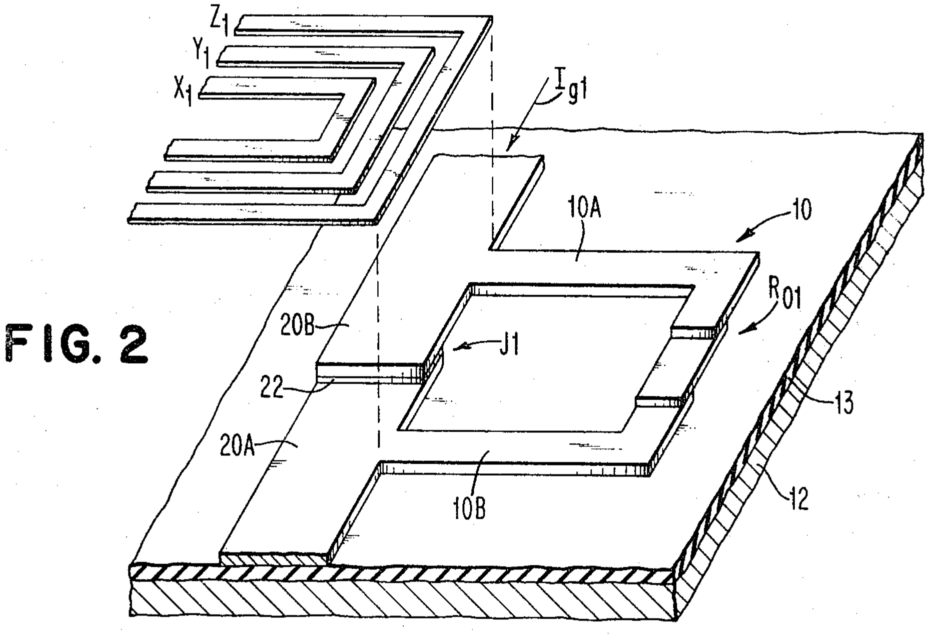
FIG. 2 is a diagram illustrating the structure of a portion of the circuits shown schematically in FIG. 1.

FIG. 2 shows the structure for a portion of the circuit illustrated in FIG. 1A. Specifically, the Josephson tunneling device J1, the control conductors X1, Y1, Z1, and superconductive transmission line 10 are shown in FIG. 2.

Josephson tunneling device J1 is comprised of superconducting electrodes 20A and 20B, which are separated by a tunnel barrier 22. The electrodes are fabricated from known superconductive materials, such as lead or tin. Preferably, tunnel barrier 22 is an oxide of the base electrode 20A, and can be for instance, lead-oxide. The manner of construction of a Josephson tunneling junction is well understood in the art and will not be described further here.

Transmission line 10 is comprised of superconductive strip lines 10A and 10B. As with the electrodes for the Josephson device J1, the strip lines are deposited by known processes such as evaporation or sputtering. In FIG. 2, they are deposited on an insulative layer 13 which is located over superconductive ground plane 12.

The control conductors X1, Y1, and Z1 are generally superconductive lines, although they need not be superconductive. If these control conductors are the output loops of other Josephson tunneling circuits, they will be superconductive lines. The control conductors X1, Y1, and Z1 are shown in the drawing as being located over Josephson device J1.

Superconducting transmission line 10 is terminated in impedance $R_{01}$ which is suitably a nonsuperconductive metal (such as copper or aluminum for instance). $R_{01}$ electrically connects 10A and 10B.

Figure 3:
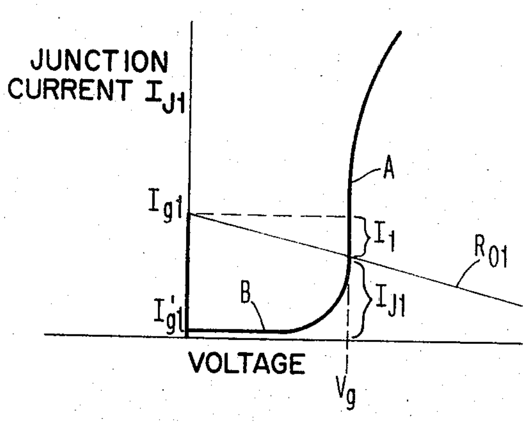
FIG. 3 is a plot of tunnel junction current versus tunnel junction voltage for a Josephson tunnel junction, used to illustrate the operation of the circuit shown in FIG. 1.
Figure 4:
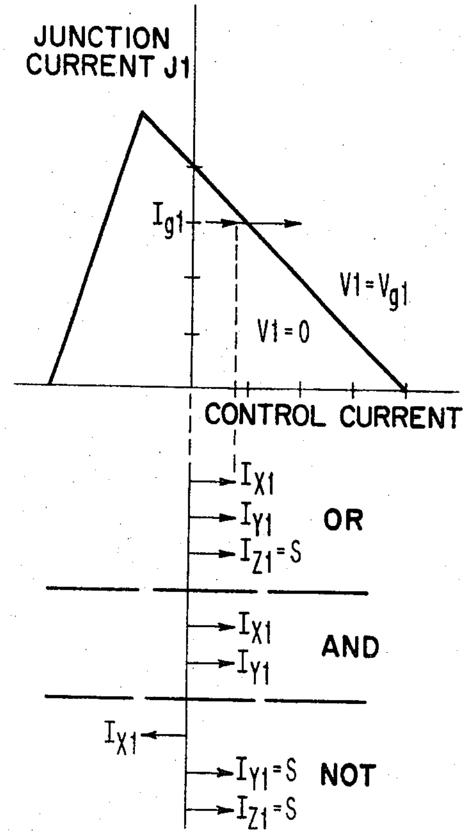
FIG. 4 is a gain curve for a Josephson tunnel junction, used to explain the operation of the circuit of FIG. 1.

FIGS. 3 and 4 are various plots of the current and voltage in tunnel junction J1 of FIG. 1A. These plots are used to describe operation of the circuit of FIG. 1A, especially as a circuit capable of providing logic functions.

FIG. 3 shows the plot of Josephson junction current $I_{J1}$ through Josephson tunnel junction J1, plotted as a function of the voltage V across junction J1. This plot shows the conventional curve denoting pair tunneling through the junction in the zero voltage state and single particle tunneling through the junction in the finite voltage state. That is, currents up to a magnitude of $I_{Jm}$ will flow through the junction in its zero voltage state. When current $I_{J1}$ through the junction exceeds this value, the junction will rapidly switch to a finite voltage state at which time the voltage across the junction will be the band gap voltage $V_g$. When current through the junction is decreased to a value less than $I_{Jm}$, the voltage across the junction will follow the curve indicated by portions A and B back to the zero voltage state.

A load line indicated by the designation $R_{01}$ is also shown in FIG. 3. This load line will be used to explain the operation of the circuit of FIG. 1A when Josephson tunnel device J1 is switched in accordance with current supplied to control conductors X1, Y1, and Z1.

Assume that J1 is in its 0 voltage state and a current $I_{g1}$ flows through device J1. If a sufficient magnetic field now intercepts J1 such that the critical current through J1 falls to a value less than $I_{g1}$, tunnel device J1 will immediately switch to a finite voltage state. Current $I_{g1}$ will then divide, a portion $I_{J1}$ going through device J1 and a portion $I_1$ going along superconductive transmission line 10. As long as current $I_{g1}$ flows from source 14, current $I_1$ will exist in superconducting transmission line 10 if J1 is in its finite voltage state. This current $I_1$ has a value $V_g/R_{01}$ and is a constant, predictable current only dependent on the tolerances of the gap voltage of tunnel device J1. The load line is generally chosen so that current $I_{J1}$ always stays above $I'_{g1}$ (minimum Josephson current) to avoid relaxation oscillations in the circuit.

Tunnel device J1 was switched to its finite voltage state following a path given by the load line $R_{01}$. If the current $I_{J1}$ is then lowered such that $I_{g1} - I_1 < I'_{g1}$, tunnel device J1 will switch back to its 0 voltage state.

FIG. 4 shows the gain curve for tunnel device J1. This curve is an asymmetric gain curve obtained by plotting current $I_{J1}$ through device J1 as a function of control current used to create a magnetic field intercepting J1. In this figure, three logical functions are indicated as being obtainable through the use of the circuit of FIG. 1A. These are the OR, AND, and NOT functions. The input control signals $I_{X1}$, $I_{Y1}$, and $I_{Z1}$ are indicated by arrows in this drawing. It is assumed that the magnitude of the control currents in each of the control conductors is the same. Of course, it can be that the magnitude of the control currents in different control conductors is different. In FIG. 4, the direction of the control current is indicated by the direction of the arrows. Arrows shown directed to the right describe control currents which will create magnetic fields intercepting J1 in a direction which adds to the self-magnetic field produced by $I_{J1}$ through device J1. Arrows pointing to the left describe control currents which will create magnetic fields that are oppositely directed to the self-magnetic field created by current $I_{J1}$ through device J1.

To understand logic operation of the circuit of FIG. 1A, it should first be noted that the region within the gain curve of FIG. 4 corresponds to the zero voltage state (V1=0) while the region outside the gain curve corresponds to the finite voltage state ($V1=V_{g1}$) of tunnel device J1. The circuit of FIG. 1A is designed such that, for a current $I_{g1}$ flowing through J1, two control currents must be present in a direction to provide magnetic fields which aid the selffield of the junction in order to switch J1 to its finite voltage state.

OR FUNCTION

To provide the OR function, control conductor Z1 has a constant bias current $I_{Z1} = S$ flowing in it. This means that only a single control current $I_{X1}$ or $I_{Y1}$ is required to be present (in addition to $I_{Z1}$) in order to switch J1 to a finite voltage state. If control currents do not flow in either conductor X1 or conductor Y1, Josephson tunnel device J1 will remain in its 0 voltage state. Consequently, the OR function is provided by this structure.

AND FUNCTION

The AND function is provided by having no current flowing in conductor Z1. This means that currents have to be present in coincidence in both X1 and Y1 in order to switch device J1 to the finite voltage state. If both of these conductors do not have control currents flowing through them at the same time, J1 remains in its 0 voltage state.

NOT FUNCTION

The NOT function is an invert in which the output is opposite to the input. To provide this function, a current having negative direction is applied in control conductor X1. After this, bias currents S are provided in control conductors Y1 and Z1. The sequence of pulses is important here. The presence of a negative current $I_{X1}$ means that the operating point moves to the left of the ordinant of the gain curve so that the presence of two bias currents will not switch the junction to its finite voltage state. If a current $I_{X1}$ is not present in control conductor X1, tunnel device J1 will be switched to the finite voltage state when bias currents S are applied in control conductors Y1 and Z1. Thus, the NOT function will be provided.

Although the sequence of applied pulses is important for operation of the circuit of FIG. 1A to provide the NOT function, the sequence of pulses applied to achieve the OR function and the AND function is not critical. It is only essential that the input pulses overlap for the AND function at some period of time in order to properly switch tunnel device J1. It should be noted here that the bias current S is either always present or never present, depending upon the logic function (AND, OR, etc.) to be obtained.

Figure 5:
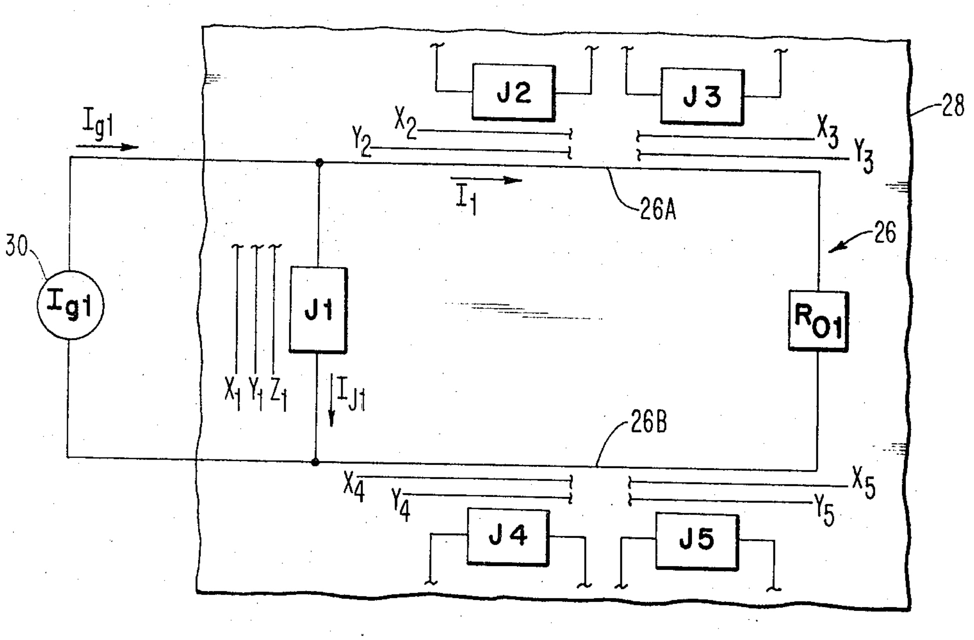
FIG. 5 is a schematic diagram of a superconductive circuit in which a plurality of Josephson tunnel junctions are connected to a transmission line, the current through which is used to control the voltage state of numerous other Josephson tunnel devices.

FIG. 5 shows a schematic of a circuit utilizing the principles explained with reference to the circuit of FIG. 1A. In FIG. 5, at least one Josephson tunneling junction J1 is connected to a superconducting transmission line 26. As in FIG. 1*a*, the transmission line is comprised of superconducting strip lines 26A and 26B which are located over a superconductive ground plane 28. Control conductors X1, Y1, and Z1 are provided for switching the voltage state of J1. Current source 30 provides current $I_{g1}$ through J1 when it is in its zero voltage state.

Superconducting transmission line 26 is terminated in an impedance $R_{01}$ which has a magnitude such that no reflections occur in superconducting transmission line 26 when current pulses I are propagated in this line due to changes in the voltage state of the superconductive tunnel device J1. Impedance $R_{01}$ is established according to the principles described with respect to FIGS. 1A, 1B.

Located adjacent strip line 26A is a plurality of other Josephson tunnel devices, indicated here by Josephson tunneling devices J2 and J3. Similarly, Josephson tunneling devices J4 and J5 are located in proximity to strip line 26B. If desired, other control lines can be provided for tunnel devices J2, J3, J4, and J5. For instance, FIG. 5 shows the presence of control lines X2 and Y2 in the proximity of J2. In this case, strip line 26A functions as an additional control line (Z2) for Josephson device J2. In a similar fashion, strip line 26B is the Z control line for tunnel devices J4 and J5.

Logic functions can be achieved with the circuitry of FIG. 5 in the same manner as that used to provide logic with the circuitry of FIG. 1*a*. For instance, the OR function is provided by causing J1 to switch as long as a single control conductor X1 or Y1 has a current flowing therein ($I_{Z1} = S$). Also, the presence of currents in any combination of these control conductors should be sufficient to provide switching of the voltage state of J1. The circuit is designed such that if tunnel device J1 switches, the current $I_{J1}$ flowing through it should remain greater than the Josephson threshold current $I_{Jm}$ of junction J1. This is to prevent the device J1 from switching back to the 0 voltage state during the time it is desired to have a current $I_1$ flowing in superconducting transmission line 26.

To further explain a logic function such as the OR function using the circuit of FIG. 5, a bias current is provided in control conductor Z1. This means that the presence of a control current in any of the remaining control conductors will switch the Josephson tunneling device J1 to the finite voltage state, thereby producing a current pulse $I_1$ in superconducting transmission line 26. As mentioned previously, the current $I_{J1}$ flowing through J1 is equal to $I_{01} - I_1$ and should always be sufficient to maintain the switched device in the finite voltage state.

The AND and the NOT functions are provided in the same manner as was described with respect to the operation of the circuit of FIG. 1A. Accordingly, these functions will not be described here.

Although it is very desirable to provide logic operations using circuitry such as has been shown here it should be understood that any type of circuit operation can be provided by structures using Josephson junctions connected to superconducting transmission lines having terminations which prevent oscillations when the Josephson device switches its voltage state. This circuit has provided predictably constant control signals having precise durations and polarities regardless of the particular properties of the Josephson tunneling devices used. In addition, stability problems due to oscillations in the circuits are not present and operation at speeds consistent with the switching speeds of Josephson devices is possible.

What is claimed is:

1. A first Josephson tunneling device, said device having two stable voltage states, current means for providing electrical current through said first Josephson tunneling device, control means for controlling the voltage state of said first Josephson tunneling device, a transmission line connected to said first Josephson tunneling device, said transmission line receiving electrical pulses therein when said first Josephson tunneling device is switched between said voltage states, said transmission line being terminated in an impedance which substantially prevents reflections in said transmission line, a second Josephson tunneling device located adjacent said transmission line, the electrical pulses in said transmission line producing a magnetic field which intercepts said second Josephson tunneling device.

2. The apparatus of claim 1, where said control means includes at least one current carrying line located adjacent said first Josephson tunneling device, current through said line producing a magnetic field which intercepts said first Josephson tunneling device.

3. The apparatus of claim 1, where said first and second Josephson tunneling devices are planar devices.

4. The apparatus of claim 1, where said transmission line is comprised of first and second strip lines insulated from a ground plane, and said termination impedance is approximately twice the characteristic impedance of each of said strip lines.

5. The apparatus of claim 1, including additional Josephson tunneling devices located adjacent said transmission line, electrical pulses in said transmission line producing a magnetic field which intercepts said additional Josephson tunneling devices.

6. The apparatus of claim 1, where said termination impedance is comprised of a nonsuperconductive material connected to said transmission line.

7. The apparatus of claim 1, where said termination impedance includes an open-ended termination of proper characteristic impedance and sufficient length for suppression of electrical pulses which are generated anywhere along said transmission line.

8. The apparatus of claim 1, where said transmission line is terminated in an impedance approximately equal to the characteristic impedance of the transmission line.

9. An apparatus using Josephson tunneling devices, comprising:

a first Josephson tunneling device having first and second electrodes and a tunnel barrier therebetween across which Josephson current can tunnel, current means for producing electrical current through said first Josephson tunneling device, an electrical energy conductor connected to said first and second electrodes of said first Josephson tunneling device and terminated in an impedance which substantially eliminates reflections of electrical pulses in said conductor, a second Josephson tunneling device located adjacent said electrical energy conductor, electrical pulses in said conductor producing magnetic fields which couple to said second Josephson tunneling device.

10. The apparatus of claim 9, including a control means for said first Josephson tunneling device for controlling the voltage state of said first Josephson tunneling device.

11. The apparatus of claim 10, where said control means for said first Josephson tunneling device is comprised of at least one current carrying conductor located sufficiently close to said first Josephson tunneling device that the magnetic field produced by current in said current carrying conductor intercepts said first Josephson tunneling device.

12. The apparatus of claim 11, including a plurality of current carrying conductors for control of the voltage state of said first Josephson tunneling device, and including means for providing sequential currents and coincident currents in said current carrying lines, the combination of the magnetic fields produced by said currents determining the voltage state of said first Josephson tunneling device.

13. The apparatus of claim 9, where said electrical energy conductor is comprised of strip lines connected to the electrodes of said first Josephson tunneling device.

14. The apparatus of claim 9, including a plurality of second Josephson tunneling devices located sufficiently close to said electrical energy conductor that the magnetic field produced by electrical pulses in said conductor will intercept said plurality of second Josephson tunneling devices.

15. The apparatus of claim 9, where said termination impedance includes an open-ended transmission line for suppression of electromagnetic reflections generated in said electrical energy conductor.

16. The apparatus of claim 9, where said electrical energy conductor is a transmission line terminated in an impedance which is approximately the characteristic impedance of said transmission line.

* * * * *